(12) United States Patent
Arndt

(10) Patent No.: US 6,573,580 B2
(45) Date of Patent: Jun. 3, 2003

(54) SURFACE-MOUNTABLE LIGHT-EMITTING DIODE STRUCTURAL ELEMENT

(75) Inventor: Karlheinz Arndt, Regensburg (DE)

(73) Assignee: Osram Opto Semiconductors GmbH & Co. OHG, Regensburg (DE)

( * ) Notice: Subject to any disclaimer, the term of this patent is extended or adjusted under 35 U.S.C. 154(b) by 0 days.

(21) Appl. No.: 10/259,556

(22) Filed: Sep. 27, 2002

(65) Prior Publication Data

US 2003/0025170 A1 Feb. 6, 2003

Related U.S. Application Data

(62) Division of application No. 10/072,836, filed on Feb. 5, 2002, now Pat. No. 6,469,321, which is a division of application No. 09/494,771, filed on Jan. 31, 2000, now Pat. No. 6,376,902.

(30) Foreign Application Priority Data

Jul. 29, 1997 (DE) .......................... 197 32 646

(51) Int. Cl.[7] ..................... H01L 30/0203; H01L 29/26; H01L 29/22
(52) U.S. Cl. ..................... 257/433; 257/79; 257/80; 257/81; 257/99; 257/100; 257/432; 257/435
(58) Field of Search ................................. 257/433, 666, 257/79, 80, 81, 99, 100, 432, 435, 787

(56) References Cited

U.S. PATENT DOCUMENTS

| | | | | |
|---|---|---|---|---|
| 4,307,297 A | * | 12/1981 | Groff et al. | 257/666 |
| 4,851,695 A | * | 7/1989 | Stein | 257/98 |
| 5,659,950 A | * | 8/1997 | Adams et al. | 257/666 |
| 5,706,177 A | * | 1/1998 | Nather et al. | 361/768 |
| 5,907,151 A | * | 5/1999 | Gramann et al. | 257/433 |
| 6,066,861 A | * | 5/2000 | Hohn et al. | 257/99 |
| 6,376,902 B1 | * | 4/2002 | Arndt et al. | 257/99 |
| 6,469,321 B2 | * | 10/2002 | Arndt et al. | 257/100 |

* cited by examiner

Primary Examiner—Jasmine J B Clark
(74) Attorney, Agent, or Firm—Laurence A. Greenberg; Werner H. Stemer; Ralph E. Locher

(57) ABSTRACT

A surface-mountable light emitting diode structural element in which an optoelectronic chip is attached to a chip carrier part of a lead frame, is described. The lead frame has a connection part disposed at a distance from the chip carrier part, and which is electrically conductively connected with an electrical contact of the optoelectronic chip. The chip carrier part presents a number of external connections for improved conduction of heat away from the chip. The external connections project from a casing and at a distance from each other.

27 Claims, 2 Drawing Sheets

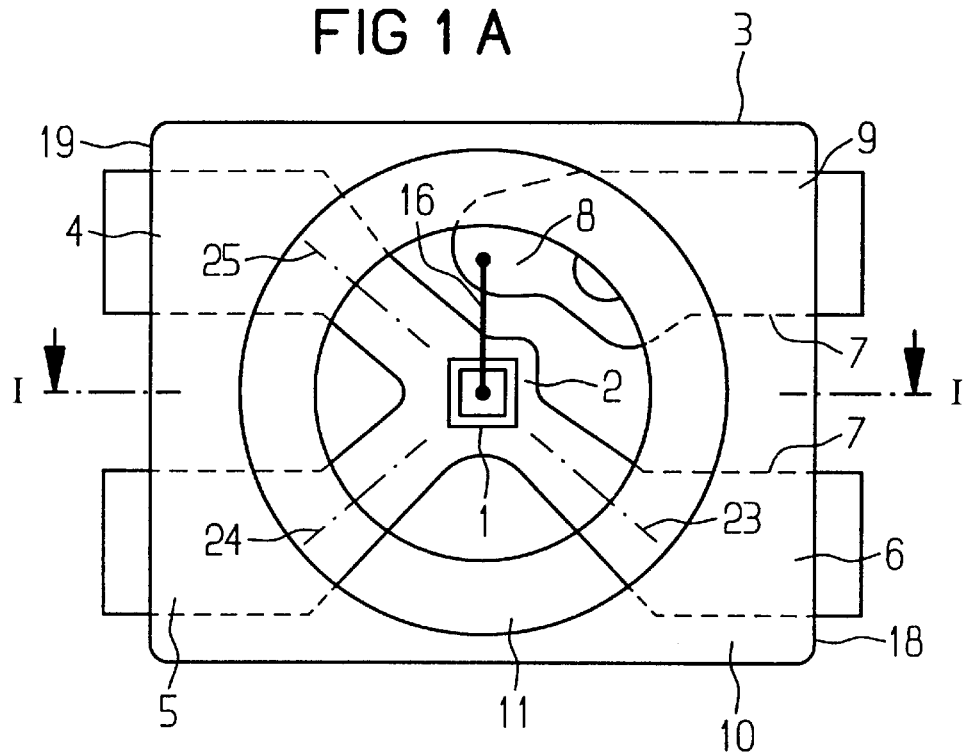
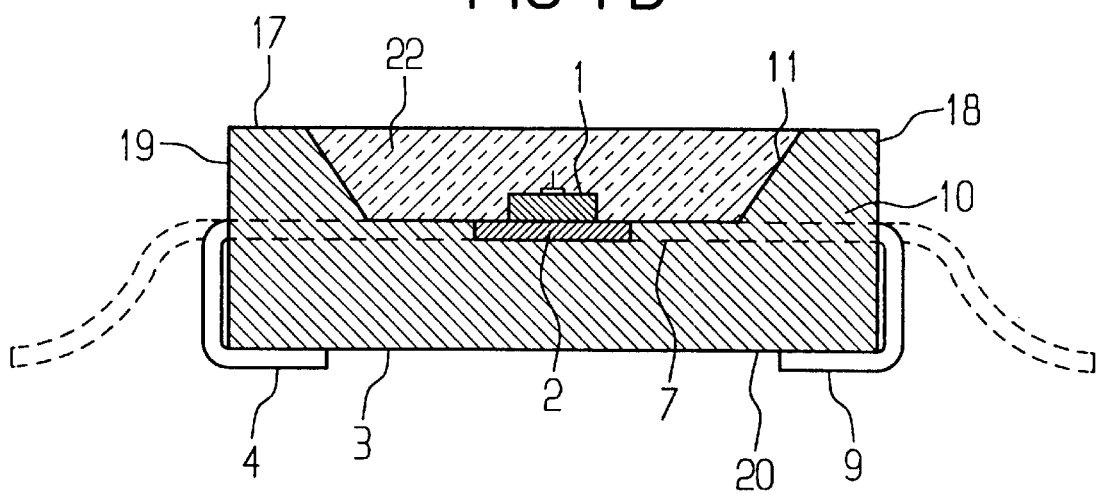

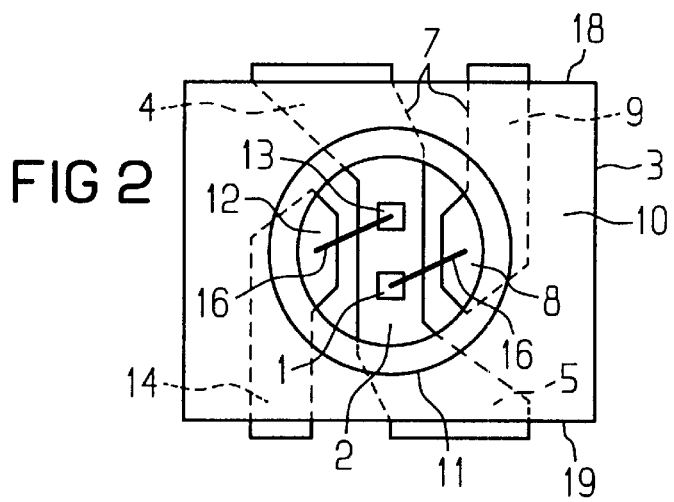
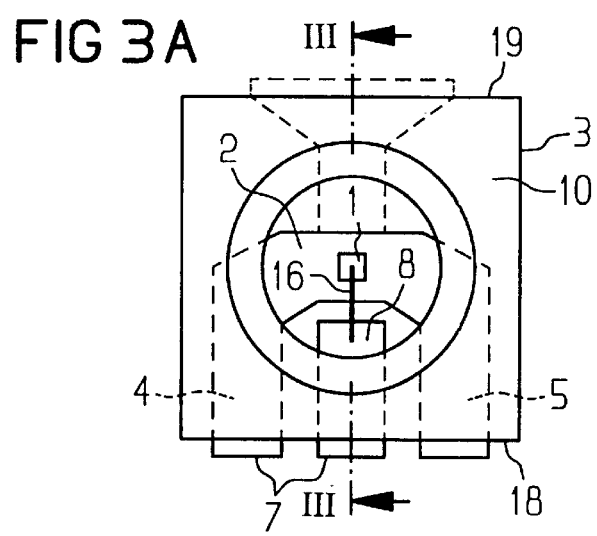
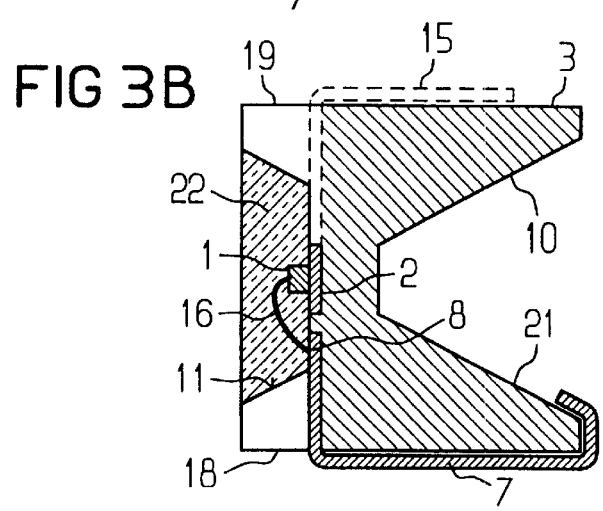

SURFACE-MOUNTABLE LIGHT-EMITTING DIODE STRUCTURAL ELEMENT

CROSS-REFERENCE TO RELATED APPLICATION

This application is a division of U.S. application Ser. No. 10/072,836, filed Feb. 5, 2002 U.S. Pat. No. 6,469,321, which was a divisional of U.S. application Ser. No. 09/494,771, filed Jan. 31, 2000, now U.S. Pat. No. 6,376,902.

BACKGROUND OF THE INVENTION

Field of the Invention

The invention relates to a surface-mountable light-emitting diode (SMD) structural element in which an optoelectronic chip is attached to a chip carrier part of a lead frame via a heat-conducting connection. The lead frame has a connecting part disposed at a distance from the chip carrier part which is connected with an electrically conducting electrical contact of the optoelectronic chip. The optoelectronic chip and a part of the lead frame are encased by a casing forming a foundation, whereby the foundation has a first main surface and a second main surface opposite the first main surface. The external connections of the chip carrier part and the connection part provided in the lead frame project outside the casing, whereby the external connections are either bent outside the foundation at first to the second main surface of the foundation opposite the first main surface and in the further course either below the foundation to its center or are bent away to form rocker-shaped connection stumps. It particularly relates to an optoelectronic structural element with an optoelectronic semiconductor chip, especially with a light-diode chip (LED) operated at a high output.

Such a structural element is known, for example from Published, European Patent Application EP 0 400 176 A. A so-called TOPLED is described here, in which a light-emitting semiconductor chip (LED chip) is attached to a flat chip carrier part of a lead frame. The lead frame consists of a chip carrier part with external connections and a connection part disposed at a distance from the latter, thus electrically insulated from it. The chip carrier part with the semiconductor chip, the connection part, and partial areas of the external connections are encased by a casing consisting of an emission-impermeable foundation with a recess and an emission-permeable window part filling this recess. The chip carrier part and the connection part are encased by the foundation or are embedded in it so that partial areas of upper sides of the chip carrier part and the connection part with the remaining floor surface tightly close the recess. The semiconductor chip is completely encased by the emission-permeable window part except for its lower side, with which it lies on the chip carrier part. The recess and its inner surfaces are formed and disposed so that they form an essentially truncated cone-shaped reflector for the radiation emitted by the semiconductor chip.

An optoelectronic structural element is described in Published, Non-Prosecuted German Patent Application DE 195 36 454 A1 in which, to improve the heat conduction of the semiconductor chip, two external connections of the chip carrier part of the lead frame are widened opposite the external connections of the connection part.

In the case of the known optoelectronic structural elements described above, the semiconductor chip operates at high currents and thereby high output, as for example is the case with so-called power-LEDs, leading to high heating because of insufficient heat conduction from the semiconductor chip. This heating frequently leads to impairments of the functional ability of the semiconductor chip, such as accelerated aging, breaking off of the semiconductor chip from the lead frame, breakage of the semiconductor chip away from the lead frame, breaking away of bond wires, or destruction of the chip. The known widened external connections of the chip carrier part favor delamination of plastic from the lead frame that, for example, can cause penetration of moisture to the semiconductor chip.

SUMMARY OF THE INVENTION

It is accordingly an object of the invention to provide a surface-mountable light-emitting diode structural element that overcomes the above-mentioned disadvantages of the prior art devices of this general type, in which improved heat conduction from the chip is assured, without at the same time substantially altering the housing dimensions and without at the same time substantially increasing delamination danger.

With the foregoing and other objects in view there is provided, in accordance with the invention, a surface-mountable light-emitting diode (SMD) structural element that is formed of a lead frame having a chip carrier part, three separate external connections, and a connection part disposed at a distance from the chip carrier part. The three separate external connections extend outward in three different directions, starting from the chip carrier part. A light-emitting semiconductor chip is heat-conductively connected to the chip carrier part of the lead frame. The light-emitting semiconductor chip has an electrical contact electrically conductively connected to the connection part. A casing is provided and has a foundation encasing the chip carrier part, the connection part and partial areas of the three separate external connections. The foundation has a first main surface, a recess formed therein, and an outward facing second main surface disposed opposite the first main surface. The three separate external connections and the connection part project outside of the casing. The three separate external connections and the connection part are bent outside of the foundation toward the outward-facing second main surface of the foundation and in a further course are further bent below the foundation toward a center of the outward-facing second main surface or away from the foundation for forming rocker-shaped connection stumps. The three separate external connections project from the casing on at least two sides of the casing at different places at a distance from each other. The heat-conducting connections as seen in a top view of the lead frame project from the casing on at least two sides and starting from the chip carrier part run toward the outside in a stellate form within the casing and separately from each other. The light-emitting semiconductor chip is disposed in the recess.

In the structural element according to the invention, it is provided for the chip carrier part to have at least three separate thermally conducting external connections connected with the chip carrier part which project from the casing at different places at a distance from each other and are configured so that they all simultaneously lie on the connection or lead plate in the assembled state of the structural element provided for mounting the structural element. The heat resulting in the chip in the operation of the structural elements is consequently fed into the lead plate at three different points and is distributed on a broad surface of the latter. A distinctly improved heat conduction from the optoelectronic chip is thereby obtained.

In a particularly preferred form of the structural element according to the invention, the external connections of the chip carrier part, in a top view of the lead frame, run separately from each other in an essentially stellate form, starting from the chip carrier part. The heat conduction points from the structural element to the lead plate thereby present large distances from each other, whereby a very large-surface distribution of the thermal energy derived from the chip in the operation of the structural element is conducted away by way of the chip carrier part and its external connections.

The external connections in the area in which they run outward in a star shape advantageously present longitudinal central axes, wherein two adjacent connections always present an angle of about 90° to each other. In this configuration, the plastic area between the connections is maximum, whereby the delamination danger is reduced, for example in the case of temperature fluctuations.

If the structural element is provided with at least a first and a second optoelectronic chip, the chip carrier part according to the invention presents at least two external connections which project from the casing at various places on it with a distance between them. The lead frame here presents at least two connection parts with an external connection in each case, which also project sideways from the casing. It is also preferable here for the external connections of the chip carrier part and the connection parts, viewed from the top of the lead frame, to essentially be disposed in the stellate form, whereby a maximum interval of the external connections of the chip carrier part from each other is assured. The thermal energy conducted from the chip in the operation of the structural element by way of the chip carrier part and its external connections is thereby fed into the lead plate at points located relatively far from each other, so that here, too, a very good heat distribution on the lead plate is obtained.

In the case of the last-mentioned structural element, it is especially advantageous for the external connections of the chip carrier part, viewed from a top view of the lead frame, to be disposed displaced diagonally to each other. They project from the chip carrier part on side surfaces opposite each other of the casing having a preferably essentially square shape. The connection parts are thereby disposed on different sides of the chip carrier part, and their external connections likewise project on side surfaces of the casing opposite each other. From a view of the lead frame, concerning the chip carrier part, they are disposed displaced diagonally to each other in relation to the external connections of the chip carrier part.

In order to further improve heat conduction from the chips, if necessary, the chip carrier part can present more than two external connections, which again project from the casing at various places at a distance from each other. The number of the external connections can be increased further as required according to the permissible structure size of the structural element.

In the case of the structural element in accordance with the invention which can be attached to the lead plate so that, in its operation, the radiation emitted by the chip is radiated essentially parallel to the lead plate (laterally emitting structural element), the chip carrier part exhibits at least two external connections and the connection part at least one external connection which project separately from each other at one and the same side surface of the casing. The external connection of the connection part is thereby preferably disposed between the two external connections of the chip carrier part. In an especially preferred further development of the last-mentioned structural element, the external connection of the connection part is narrower than the two external connections of the chip carrier part. Of course, the external connections of the chip carrier part can optionally also be wider than the external connections of the connection parts.

In a further development of the above mentioned side-emitting structural element, the chip carrier part is additionally provided with greater heat conduction via at least one heat-conducting cooling fin, which projects from a side surface of the casing other than from where the connection parts project. The cooling fin alone or a further cooling device thermally attached to the cooling fin assures a still further improved heat conduction from the chip.

Other features which are considered as characteristic for the invention are set forth in the appended claims.

Although the invention is illustrated and described herein as embodied in a surface-mountable light-emitting diode structural element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1a is a diagrammatic, top plan view of a first embodiment of a structural element with a single optoelectronic chip according to the invention;

FIG. 1b is a schematic representation of a section through the structural element of FIG. 1 taken along the line I—I;

FIG. 2 is a top plan view of a second embodiment of the structural element having at least two optoelectronic chips;

FIG. 3a is a side-elevational view of a third embodiment of the structural element with emission to a side; and FIG. 3b is a side section view through the structural element of FIG. 3a taken along the line III—III shown in FIG. 3.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1a thereof, there is shown a structural element, more specifically, a light diode structural element. The structural element has a light-emitting semiconductor chip 1 (LED chip) attached to a chip carrier part 2 of a lead frame 7 by a good heat-conducting material, for example by metal soldering. Three separate external connections 4, 5, 6 extend outwards in three different directions, starting from the chip carrier part 2. At a distance from the chip carrier part 2 with the external connections 4, 5, 6, a connection part 8 with an external connection 9 is disposed, which is connected with an electrical contact of the LED chip 1, e. g., with anode contacting, by use of a bond wire 16. A second contact metallizing (cathode contacting) of the LED chip 1 is located, for example, at its lower side turned to the chip carrier part 2 and is electrically conductively connected with the chip carrier part 2 by an electrically conducting material. Consequently, the chip carrier part 2 with the external connections 4, 5, 6 serves in this case as both a cathode connection and as a thermal connection for heat conduction away from the LED chip 1.

If the cathode contact is not disposed on a lower side of the chip 1, as in the above mentioned case, but instead on its upper side, for example, it can be connected electrically conductively with the chip carrier part 2 by a bond wire. The chip carrier part 2, the connection part 8, and partial areas of the external connections 4, 5, 6, 9 are encased by an essentially square foundation 10 of a casing 3, which has a recess 11 (FIG. 1*b*). The recess 11 essentially has the form of a truncated cone and extends from a main surface 17 of the foundation 10 running parallel to the lead frame 7 and up to the lead frame 7. A cross-section of the recess 11 increases from the lead frame 7 to the main surface 17 of the foundation 10. The LED chip 1 is located in the recess 11, which is provided with a radiation-permeable window part 22, preferably with a transparent plastic sealing. Together with the foundation 10, the window part 22 forms the casing 3 of the structural element. The external connections 4, 5, 6, 9 project from the latter on opposite side surfaces 18, 19 of the foundation 10.

Starting from the chip carrier part 2, the external connections 4, 5, 6 run apart within the foundation 10 first in a stellate form and then break in their further course, so that they penetrate the side surfaces 18, 19 perpendicularly.

The chip carrier part 2 preferably lies completely within a floor surface of the recess 11.

The external connections 4, 5, 6 have longitudinal center axes 23, 24, 25 in an area in which they run outwards in the stellate form, two adjacent units of which always form an angle of about 90°.

The external connections 4, 5, 6, 9 are bent outside of the foundation 10 first to a second main surface 20 of the foundation 10 opposite the first main surface 17 and in their further course below the foundation 10 to its center. However, as is indicated by the dotted line in FIG. 1*b*, they can also be bent to form rocker-shaped connection stumps. This also represents a form of external electrical connection usual in surface assembly technology. These kinds of external connections for surface-mountable structural elements (SMD) are known and therefore will not be illustrated further.

The external connections 4, 5, 6, 9 are consequently formed so that they all lie simultaneously on the connection or lead plate in the assembled state of the structural element in the lead plate provided for assembling the structural element.

Inner surfaces of the recess 11 form a reflector for the emission radiated by the LED chip 1 in the operation of the structural element. They are optionally coated with a reflection-enhancing material. The foundation 10 can alternatively consist of a reflection-enhancing material.

In the execution example of FIG. 2, in distinction to the execution example of FIGS. 1*a* and 1*b*, two differently colored lighting LED chips 1, 13 are attached to the chip carrier part 2 of the lead frame 7 by a thermally and electrically conducting material. The first 8 and a second connection part 12 are disposed on opposite sides of the chip carrier part 2 at a distance from it, each having an external connection 9, 14. The external connections 9, 14 run displaced parallel to each other; as seen from the chip carrier part 2, they extend in opposite directions to each other and extend out from the opposite side surfaces 18, 19 of the foundation 10. They are electrically conductively connected with the anode contacts of the LED chips 1, 13 by the bond wires 16.

The chip carrier part 2 exhibits the two external connections 4, 5 which, starting from the chip carrier part 2, likewise extend displaced parallel to each other in opposite directions parallel to the external connections 9, 14 of the connection parts 8, 12 and project out on the opposite side surfaces 18, 19 of the foundation 10.

As in the case of the first embodiment of FIGS. 1*a* and 1*b*, the emission-impermeable foundation 10 has the truncated cone recess 11, which is provided with the transparent window part 22. The LED chips 1, 13 are located in the recess 11.

The external connections 4, 5, 9, 14 project out of the foundation 10 on the opposite side surfaces 18, 19. They are formed outside the foundation 10 analogously to the first embodiment according to FIGS. 1*a* and 1*b*.

In the case of the first and second embodiments of FIGS. 1*a*, 1*b* and 2 described above, the casing 3 and the external connections 4, 5, 6, 9, 14 are configured in all cases so that the emission transmitted from the LED chip 1 or chips 1, 13 in the operation of the structural element is radiated essentially perpendicularly to the assembly surface of the lead plate provided for the assembly of the structural element.

The execution example of FIGS. 3*a* and 3*b* relate to a so-called sideways emitting LED structural element. This type of structural element has already been explained in the general part of the specification. The casing 3 and the external connections 4, 5 and 9 of the chip carrier part 2 or the connection part 8 are configured in this structural element so that it can be attached to the side surface 20 of the foundation 10 to the assembly surface of the lead plate.

Moreover, the lead frame 7 has the chip carrier part 2, which has at least two of the external connections 4, 5. Starting first from the chip carrier part 2, to which the LED chip 1 is attached by a thermally and electrically conducting material, the external connections 4, 5 extend in essentially opposite directions to the outside. In their further course, they break in the same direction, so that they then run parallel to each other in the same direction. The connection part 8 with the external connection 9, which runs parallel to the two external connections 4, 5 of the chip carrier part 2 in the same direction that they run, is disposed between the two external connections 4, 5 of the chip carrier part 2.

The chip carrier part 2, whose external connections 4, 5, and the connection part 8 with the external connection 9 are enclosed by the radiation-impermeable foundation 10 analogously to the first and second embodiments described above, which has the truncated cone recess 11, is disposed in the LED chip 1. Here, too, the recess 11 is provided with the emission-permeable window part 22, which preferably consists of an emission-permeable plastic. The external connections 4, 5, 9, which project from it on one and the same side surface 18 of the foundation 10, are bent downward outside the foundation 10 in the direction of the back side of the foundation 10 and are bent in their further course along a back side 21 of the foundation 10 to its center. The outer surfaces of the external connections 4, 5, 9 turned away from the side surface 18 of the foundation 10 form a support surface of the structural element for its mounting on the lead plate.

For additional cooling of the LED chip 1, the chip carrier part 2 has cooling fin 15 (indicated by dotted line in FIGS. 3*a* and 3*b*). It projects out of the side surface 18, from which the external connections 4, 5, 9 project, on the opposite side surface 19 of the foundation 10 and is bent outside the foundation 10 to its back side, so that it lies on the side surface 19. Further cooling devices can optionally be attached thermally to the cooling fin 15.

In all the embodiments described above, it is preferable for the external connections of the chip carrier part 2 to be wider than the external connections of the connection part or parts 8, 12. A further improved heat transfer from the LED chip 1 can thereby be attained with substantially unchanged housing dimensions. However, the external connections 4, 5, 6, 9, 14 can all have the same width.

Especially large soldering pads are provided on the lead plate provided for the assembly of the structural element in order to attain a further improvement in heat transfer from the LED chip 1. They are also disposed in the stellate form and can thus distribute the heat conducted from the LED chip 1 over a large surface. The lead frames 7 of the structural elements according to the invention conduct the heat from the LED chip 1 in the stellate form to the outside of the casing 3. The heat is thereby fed to points in the plate lying far from each other. Large metal linings consisting of copper are preferably located on the plate around each soldering pad, which distribute the heat on the lead plate. The heat resistance of the casing (housing) 3 according to the invention is distinctly reduced in comparison with the heat resistance of commercial housings.

The housing 3 for the LED chips 1 described above relates to a housing for optoelectronic structural elements known in semiconductor technology. The separate forms and the materials and manufacturing processes used therefore will not be explained further.

To be sure, the description of the invention on the basis of the disclosed embodiments is not to be understood to be a limitation of the invention to these examples.

I claim:

1. A surface-mountable light-emitting diode structural element, comprising:
   a lead frame having a chip carrier part, at least three separate external connections, and a connection part disposed at a distance from said chip carrier part, said at least three separate external connections extending outward in three different directions, starting from said chip carrier part;
   a light-emitting semiconductor chip being heat-conductively connected to said chip carrier part of said lead frame, said light-emitting semiconductor chip having an electrical contact being electrically conductively connected to said connection part; and
   a casing encasing said chip carrier part, said connection part, and portions of said at least three separate external connections, said casing having a first main surface, a second main surface disposed opposite said first main surface and side surfaces;
   said at least three separate external connections and said connection part projecting outside of said casing;
   said at least three separate external connections projecting from said casing on at least two of said side surfaces of said casing at different places at a distance from each other;
   said at least three separate external connections configured for simultaneously lying on and being mounted on a connection or a plate; and
   said at least three separate external connections, as seen in a top view of said lead frame starting from said chip carrier part, running separately outward in a stellate form within said casing.

2. The light-emitting diode structural element according to claim 1, wherein: said connection part has an external connection that is narrower than said at least three separate external connections connected to said chip carrier part.

3. The light-emitting diode structural element according to claim 1, comprising: at least one cooling fin connected to said chip carrier part for conducting heat away from said chip carrier part, said at least one cooling fin projecting on one of said side surfaces of said casing on which said connection part and said three separate external connections do not project.

4. The light-emitting diode structural element according to claim 1, wherein: said casing is formed completely of a radiation-permeable material.

5. The light-emitting diode structural element according to claim 1, wherein: said casing has a recess formed therein and an emission-permeable window part disposed in said recess.

6. The light-emitting diode structural element according to claim 5, wherein said casing has a foundation formed of an emission-impermeable material.

7. The light-emitting diode structural element according to claim 5, wherein: said casing has an inside and an outside; and said recess defines a cross-section widening from said inside of said casing toward said outside of said casing.

8. The light-emitting diode structural element according to claim 7, wherein: said casing has a foundation formed with inner surfaces defining said recess; said inner surfaces serve as reflectors for an emission that will be transmitted by said light-emitting semiconductor chip and for an emission that will be received by said light-emitting semiconductor chip.

9. The light-emitting diode structural element according to claim 1, wherein: said at least three separate external connections define longitudinal central axes where said at least three separate external connections run separately outward in the stellate form within said casing; and two of said at least three separate external connections define an angle of about 90° with respect to each other.

10. The light-emitting diode structural element according to claim 1, wherein: starting from said chip carrier part, said at least three separate external connections run apart within said casing first in a stellate form and then break to perpendicularly penetrate said side surfaces.

11. The light-emitting diode structural element according to claim 1, wherein: said casing has a foundation; said at least three separate external connections and said connection part being bent outside of said foundation toward said second main surface and in a further course being bent in a manner selected from a group consisting of being bent below said casing toward a center of said second main surface and being bent away from said casing for forming rocker-shaped connection stumps.

12. An optoelectronic surface-mountable structural element, comprising:
   a lead frame having a chip carrier part, external connections, and a first and second connection part disposed at a distance from said chip carrier part, at least two of said external connections being thermally conductively connected to said chip carrier part;
   a first and a second optoelectronic chip heat-conductively connected to said chip carrier part of said lead frame, said first optoelectronic chip having an electric contact electrically conductively connected to said first connection part, and said second optoelectronic chip having an electrical contact electrically conductively connected to said second connection part; and
   a casing encasing said first optoelectronic chip, said second optoelectronic chip, and a part of said lead frame;
   said casing having a first main surface and an outwardly facing second main surface disposed opposite said first main surface;

said external connections, said first connection part, and said second connection part projecting outside of said casing;

said external connections, said first connection part, and said second connection part being bent outside of said casing toward said outwardly facing second main surface of said casing and in a further course being further bent according to one of below said casing toward a center of said outwardly facing second main surface and away from said casing;

said at least two of said external connections, as seen from a top view of said lead frame, projecting from said casing on two opposite sides, and starting from said chip carrier part, extending in opposite directions toward the outside; and said first connection part and said second connection part, as seen from the top view of said lead frame, being disposed on opposite sides of said chip carrier part, extending in opposite directions, and projecting from said casing at two opposite sides.

13. The optoelectronic structural element according to claim 12, wherein: said first optoelectronic chip and said second optoelectronic chip emit differently colored light.

14. The optoelectronic structural element according to claim 12, wherein: said first connection part and said second connection part each have an external connection that is narrower than said external connections connected to said chip carrier part.

15. The optoelectronic structural element according to claim 12, wherein: said casing is formed completely of a radiation-permeable material.

16. The optoelectronic structural element according to claim 12, wherein: said casing has a recess formed therein and an emission-permeable window part disposed in said recess.

17. The optoelectronic structural element according to claim 16, wherein: said casing is formed of an emission-impermeable material, said casing has a foundation partially encasing said chip carrier part, and said first optoelectronic chip and said second optoelectronic are disposed in said recess.

18. The optoelectronic structural element according to claim 17, wherein: said casing has an inside and an outside; and said recess defines a cross-section widening from said inside of said casing toward said outside of said casing.

19. The optoelectronic structural element according to claim 18, wherein: said casing has inner surfaces defining said recess; said inner surfaces serve as reflectors for an emission that will be transmitted by said light-emitting semiconductor chip and for an emission that will be received by said light-emitting semiconductor chip.

20. An optoelectronic surface-mountable, laterally emitting structural element, comprising:

a lead frame having a chip carrier part, external connections, and a connection part disposed at a distance from said chip carrier part, at least two of said external connections being heat-conducting connections thermally conductively connected to said chip carrier part;

an optoelectronic chip-heat conductively connected to said chip carrier part of said lead frame, said optoelectronic chip having an electrical contact electrically conductively connected to said connection part; and a casing encasing said optoelectronic chip and a part of said lead frame;

said casing having a first main surface and an outwardly facing second main surface disposed opposite said first main surface;

said external connections and said connection part projecting outside of said casing;

said external connection and said connection part being bent outside of said casing toward said outwardly facing second main surface of said casing and in a further course being further bent toward a center of said outward facing second main surface;

said at least two of said external connections and said connection part projecting from said casing at a same side of said casing at different places at a distance from each other;

said at least two of said external connections, as seen in a top view of said lead frame, projecting from said casing on the same side and, starting from said chip carrier part, running toward the outside in different directions and breaking in said further course in a same direction within said casing; and said connection part being disposed between said at least two of said external connections.

21. The optoelectronic structural element according to claim 20, wherein: said connection part has an external connection that is narrower than said external connections connected to said chip carrier part.

22. The optoelectronic structural element according to claim 20, comprising: at least one cooling fin connected to said chip carrier part for conducting heat away from said chip carrier part, said at least one cooling fin projecting on a side surface of said casing on which said connection part and said external connections do not project.

23. The optoelectronic structural element according to claim 20, wherein: said casing is found completely of a radiation-permeable material.

24. The optoelectronic structural element according to claim 20, wherein: said casing has a recess formed therein and an emission-permeable window part disposed in said recess.

25. The optoelectronic structural element according to claim 20, wherein: said casing is formed on an emission-impermeable material, said chip carrier part is partially encased by said foundation, and said optoelectronic chip is disposed in said recess.

26. The optoelectronic structural element according to claim 20, wherein: said recess has a cross-section widening in its course from inside said casing toward an outside of said casing.

27. The optoelectronic structural element according to claim 23, wherein: said casing has inner surfaces defining said recess and said inner surfaces are reflectors for an emission transmitted by said optoelectronic chip and an emission to be received by said optoelectronic chip.

* * * * *

UNITED STATES PATENT AND TRADEMARK OFFICE
CERTIFICATE OF CORRECTION

PATENT NO. : 6,573,580 B2
DATED : June 3, 2003
INVENTOR(S) : Karlheinz Arndt

It is certified that error appears in the above-identified patent and that said Letters Patent is hereby corrected as shown below:

<u>Title page,</u>
Item [62], should read as follows:

-- Division of application No. 10/072,836, filed on Feb. 5, 2002, now Pat. No. 6,469,321, which is a division of application No. 09/494,771, filed on Jan. 31, 2000, now Pat. No. 6,376,902 which is a continuation of application No. PCT/DE98/02125, filed on Jul. 27, 1998. --

Signed and Sealed this

Sixteenth Day of September, 2003

JAMES E. ROGAN
*Director of the United States Patent and Trademark Office*